US006969917B2

(12) United States Patent
Hacke et al.

(10) Patent No.: US 6,969,917 B2
(45) Date of Patent: Nov. 29, 2005

(54) ELECTRONIC CHIP COMPONENT WITH AN INTEGRATED CIRCUIT AND FABRICATION METHOD

(75) Inventors: Hans-Jürgen Hacke, München (DE); Manfred Wossler, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/347,324

(22) Filed: Jan. 17, 2003

(65) Prior Publication Data

US 2003/0127750 A1    Jul. 10, 2003

Related U.S. Application Data

(63) Continuation of application No. PCT/DE01/02098, filed on Jun. 7, 2001.

(30) Foreign Application Priority Data

Jul. 17, 2000    (DE) ............................... 100 46 296

(51) Int. Cl.[7] ...................... H01L 23/48; H01L 23/52; H01L 29/40
(52) U.S. Cl. ...................... 257/785; 257/783; 257/786; 257/782; 257/778
(58) Field of Search ............................ 257/782, 783, 257/785, 786, 779, 778, 753, 766

(56) References Cited

U.S. PATENT DOCUMENTS

| | | |
|---|---|---|
| 5,118,370 A | 6/1992 | Ozawa |
| 5,517,752 A | 5/1996 | Sakata et al. |
| 5,579,573 A | 12/1996 | Baker et al. |
| 5,635,764 A * | 6/1997 | Fujikawa et al. ........... 257/766 |
| 5,925,936 A | 7/1999 | Yamaji |
| 6,002,163 A * | 12/1999 | Wojnarowski ............... 257/620 |
| 6,063,647 A * | 5/2000 | Chen et al. .................. 438/108 |
| 6,462,284 B1 * | 10/2002 | Hashimoto ................... 174/260 |
| 6,710,454 B1 * | 3/2004 | Boon .......................... 257/777 |
| 6,774,493 B2 * | 8/2004 | Capote et al. .............. 257/778 |
| 2003/0222295 A1 * | 12/2003 | Lin ............................ 257/300 |

FOREIGN PATENT DOCUMENTS

| | | |
|---|---|---|
| DE | 40 08 624 A1 | 10/1990 |
| DE | 195 29 490 A1 | 2/1997 |
| JP | 01-198017 | 8/1989 |
| JP | 02268451 A | 11/1990 |
| JP | 05041407 | 2/1993 |
| JP | 05-291351 | 11/1993 |

(Continued)

OTHER PUBLICATIONS

Johnson, C. D. et al.: "Wafer Scale Packaging Based on Underfill Applied at the Wafer Level for Low-Cost Flip Chip Processing", IEEE Eletronic Components and Technology Conference, Jun. 1, 1999, pp. 950-954.

(Continued)

*Primary Examiner*—Minhloan Tran
*Assistant Examiner*—Victor A. Mandala, Jr.
(74) *Attorney, Agent, or Firm*—Laurence A. Greenberg; Werner H. Stemer; Ralph E. Locher

(57) ABSTRACT

The invention relates to an electronic chip component and a method for fabricating the chip component with a semiconductor chip having an integrated circuit therein. Contact surfaces are on the active surface of the semiconductor chip. The contact surfaces of the integrated circuit have a contact layer consisting of pressure contact material, which protrudes beyond the level of the top non-conductive layer. The active surface of the semiconductor chip includes a meltable glue layer that is adapted to the height of the contact layer.

54 Claims, 2 Drawing Sheets

FOREIGN PATENT DOCUMENTS

| | | |
|---|---|---|
| JP | 07-263474 | 10/1995 |
| JP | 08-045918 | 2/1996 |
| JP | 09-330932 | 12/1997 |
| JP | 11274241 | 10/1999 |
| JP | 2000031203 A | 1/2000 |
| JP | 2000-150705 | 5/2000 |
| JP | 2000-164639 | 6/2000 |
| JP | 2004-504723 | 2/2004 |
| WO | WO 96/13066 | 5/1996 |
| WO | WO 99/56312 | 11/1999 |

OTHER PUBLICATIONS

Erickson, C.: "Wafer Bumping: The Missing Link for DCA", Electronic Packaging & Production, vol. 38, No. 8, Jul. 1, 1998, pp. 43-44 and 46.

* cited by examiner

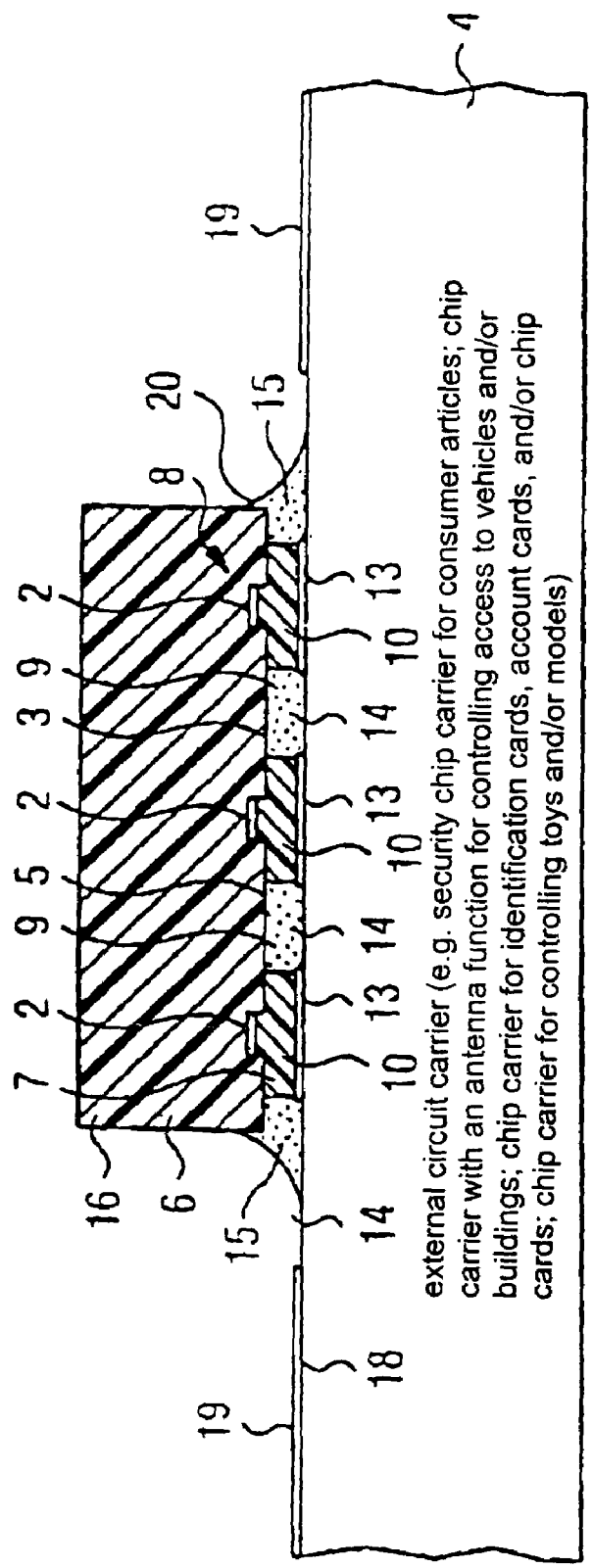

ELECTRONIC CHIP COMPONENT WITH AN INTEGRATED CIRCUIT AND FABRICATION METHOD

CROSS-REFERENCE TO RELATED APPLICATION

This application is a continuation of copending International Application No. PCT/DE01/02098, filed Jun. 7, 2001, which designated the United States and was not published in English.

BACKGROUND OF THE INVENTION

Field of the Invention

The invention relates to an electronic chip component with an integrated circuit and a fabrication method. Integrated circuits are increasingly being used in applications for which the quality and reliability demands of the bond between the semiconductor chip and the contact terminal pads of an external circuit carrier are different than in applications such as telecommunications, aerospace, traffic engineering, or medical technology, given correspondingly extreme conditions. Chip components with integrated circuits that are not subject to extreme demands with respect to thermal-shock resistance at extremely high or low temperatures, or are not stored at high temperatures belong to the "low tech" class of chip components, which covers a segment of applications in which the cost-intensive bonding techniques of conventional chip components must be replaced by more economical solutions.

SUMMARY OF THE INVENTION

It is accordingly an object of the invention to provide an electronic chip component and a method for producing the component, which overcome the above-mentioned disadvantages of the prior art apparatus and methods of this general type.

In particular, it is an object of the invention to simplify the bonding technique and to reduce the costs of bonding chip components to chip carriers.

With the foregoing and other objects in view there is provided, in accordance with the invention, an electronic chip component that includes an integrated circuit in a semiconductor chip which has contact terminal pads on its active surface for connecting the integrated circuit to external carriers. To that end, the pads include a contact layer consisting of pressure contact material opposite the level of the top electrically non-conductive layer of the integrated circuit, and they protrude beyond the top non-conductive level. Furthermore, at least the active surface of the semiconductor chip which is not occupied by the pads is covered by a meltable adhesive layer that is adjusted to the height of the contact layer.

The advantage of this type of electronic chip component is that it can be delivered without an additional housing and mounted directly on an external circuit carrier upon the making of pressure contact between the pressure contact surfaces of the electronic chip component and the terminal pads of the external circuit carrier. Another advantage of this electronic chip component is that the pads can be simultaneously prepared with an additional contact layer for several integrated circuits while directly on a semiconductor wafer, and likewise a suitable meltable adhesive layer can be applied for several integrated circuits and thus several electronic chip components in one step when the semiconductor wafer is in an undivided state. Lastly, an essential advantage of the inventive electronic chip component is that it can be marketed without a housing, so that the customer is free to design the shape of the external circuit carrier and to form very flat circuit carriers equipped with electronic chip components. Besides this, the inventive electronic chip component with pressure contact surfaces allows mounting in or on external flexible carriers, because the inventive pressure contact technique allows a wide tolerance with respect to matching the thermal expansion characteristics of the semiconductor chip and the circuit carrier.

In an embodiment of the invention, the external circuit carrier is a security chip carrier for consumer goods. These security chip carriers are equipped with integrated security circuits in order to identify the consumer article by what are known as tags, logistically manage it, and secure it against unauthorized removal. Because consumer articles that are so secured are stored, managed, and sold in large quantities in climate-controlled spaces, the electronic chip component on the security chip carrier can also contribute to lowering the cost of the consumer article, based on the cost-effective fabrication of the electrical bond sites between the chip carriers and the electronic chip components.

In another embodiment of the invention, the external circuit carrier is a chip carrier with an antenna function for controlling access to vehicles and/or buildings. This instance of application of the inventive chip component also takes advantage of the ability to adapt the electronic chip component, given its lack of a specific housing form, to a chip carrier with any shape, the head of a building key or vehicle key, or other access control devices that are equipped with an antenna function.

In another embodiment of the invention, the external circuit carrier is a chip carrier for identification, account, telephone and/or ATM cards. This embodiment also takes advantage of the fact that the electronic chip component has no housing parts and can therefore be easily and efficiently glued onto the respective cards or housed in corresponding recesses of the cards. The flexibility of the pressure contact solution of this electronic chip component also comes into play in this embodiment.

In another embodiment of the invention, the external circuit carrier is a chip carrier for controlling toys and/or models. In this application of the invention, the inexpensive production and processing of the inventive electronic chip component come into play. In principle, each electronic chip component can be part of a kit from which toys and models are built, because the electronic chip component for the kit is easy to handle, replaceable, and reusable by virtue of the meltable glue layer.

In another embodiment, the glue layer is thicker between the pressure contact surfaces than on the surfaces. These thickness differences can be realized in the application of the glue layer on a semiconductor wafer by the selected application technique, particularly if the adhesive layer is implemented by roll coating with film-forming media. Processing and utilization advantages are gained by the adhesive layer having a thickness difference between the pressure contact surface and the remaining surface region of a semiconductor wafer; namely, only slight heating is needed in order for the pressure contact surfaces to penetrate an ultra-thin glue layer when slight pressure is applied.

When the adhesive layer material is specifically selected based on the surfaces that will be glued and the surfaces that will be free of glue, in the molten state the glue layer wets the electronically non-conductive top layer of the integrated circuit and the surface region of the circuit carrier excluding the terminal pads and does not wet the pressure contact surfaces of the electronic chip component itself or the terminal pads on the circuit carrier. What is achieved by so tuning the wetting characteristics of the material of the adhesive layer to the materials of the electronic chip component and the external circuit carrier, is that, in the molten state, the glue layer regions are separated from the regions of the pressure contact surfaces and the terminal pads by the glue withdrawing to the wettable surface regions.

In another embodiment of the invention, the pressure contact surfaces can be roughened for improving their contact making ability. The roughening can be performed with the fabrication or deposition of the pressure contact material or in an additional roughening step, which can serve for simultaneously clearing glue that may adhere to the contact pressure surfaces of the whole semiconductor wafer.

In another embodiment of the invention, the pressure contact material of the pressure contact surface is a ductile electrically conductive metal alloy. The ductility of the metal alloy guarantees that the pressure contact surface can conform to the surface of the terminal pad of an external circuit carrier. In particular, ductility is advantageous when the terminal pads are in a roughened state following the preparation of the circuit carrier; it being possible for ductile conductive metal material to work its way into the rough surface of the contact terminal pads of the circuit carrier during the pressure contacting process.

In another embodiment of the invention, the pressure contact material is an oxidation resistant metal alloy. Such a metal alloy guarantees that the ability of the pressure contact surfaces to be conductively contacted is not compromised over time by oxidation, but rather that a durable electrical contact exists between the contacted components.

In another embodiment, the pressure contact material of the pressure contact surfaces is a nickel-gold alloy. The gold portion provides for the required oxidation resistance, and the nickel portion provides for the desired strength of the pressure contact. Silver-based pressure contact materials have the advantage that silver does not react with the oxygen or water molecules in the air, but rather forms silver sulfite in a normal atmospheric environment, which, unlike most metal oxides, remains electrically conductive. An indium-based pressure contact material has the advantage that indium oxide is one of few conductive oxides and therefore the pressure contact itself is not appreciably degraded during the operating lifetime by the atmospheric oxygen.

In another embodiment of the invention, the pressure contact surfaces protrude 1.5 to 8 $\mu$m beyond the top non-conductive layer of the integrated circuit. This superelevating of the contact surfaces of the integrated circuit guarantees that a reliable pressure contact to the contact terminal pads of an external circuit carrier is achievable when the electronic chip component is glued on. To that end, the glue layer is at least as thick as the contact layer and is arranged between the pressure contact surfaces. If the glue layer is thinner than the contact layer, there arises the risk that the glue volume may not suffice for joining the chip component with the circuit carrier in such a way that a reliable contacting of the contact pressure surfaces and the terminal pads is guaranteed.

To the extent that the glue surpasses the thickness of the pressure contact surfaces and is positioned partly on the pressure contact surfaces, it is displaced by the pressure contact surfaces in the contacting of the electronic chip component with the external circuit carrier and partly fills the intermediate spaces between the terminal pads of the external circuit carrier. This embodiment of the electronic chip component is associated with the advantage that the excess glue volume is so dimensioned that the interspace between the top non-conductive layer of the chip component and the surface of the circuit carrier which is not covered by the terminal pads is partly wetted with glue, so that when the molten glue cools, an intensive contact is achieved between the pressure contact surfaces of the electronic chip component and the terminal pads of the chip carrier. In this embodiment, it is desirable to superelevate the pressure contact surfaces beyond the level of the glue layer in order to guarantee filling of the abovementioned interspaces between the electronic chip component and the circuit carrier.

In one of the inventive embodiments, the glue consists of a thermosetting plastic, preferably glycolester terephthalate, whose molten volume is larger than the volume of the hard plastic, so that the tensions that arise in the setting plastic additionally pull the electronic chip component onto the external circuit carrier in an advantageous fashion, so that an intensive pressure contact is guaranteed between the pressure contact surfaces and the terminal pads.

With the foregoing and other objects in view there is provided, in accordance with the invention, a method for fabricating a plurality of electronic chip components. The method includes steps of: providing a semiconductor wafer having a plurality of integrated circuits; producing a plurality of superelevated pressure contact surfaces by selectively applying a contact layer including pressure contact material to contact surfaces of the semiconductor wafer; applying a meltable glue layer, which is adjusted to a height of the contact layer, to a surface of the semiconductor wafer; and obtaining a plurality of integrated circuits having a plurality of pressure contact surfaces by dividing the semiconductor wafer.

The advantage of this method is that the essential steps, namely the selective application of a contact layer, and the application of a glue layer for the electronic components, occur before a wafer is divided into individual electronic chip parts. Furthermore, by this technique it is possible to join the chip parts with an external circuit carrier using a pressure contact without any bonding or soldering required. A contact connection between the two components can be thereby created without a large outlay at a relatively low temperature of the meltable glue layer. Furthermore, the meltable glue is applied in such a thin layer that extremely short contacting times are possible.

Beyond this, applying the meltable glue to the chips in the compound wafer makes it possible to prepare a very large number of chips simultaneously in a particularly cost-effective manner. This method thus enables a procedure, for fabricating chip connections with low mounting heights, which is more rapid and thus more cost-effective than known contacting methods. The invention thus opens up the possibility to achieve a simple and inexpensive glue application already on the wafer level and to achieve extremely short contacting times using molten glue.

With the foregoing and other objects in view there is provided, in accordance with the invention, a method for contacting an electronic chip component and an external circuit carrier. The method includes steps of: obtaining an individual electronic chip component by performing the method for fabricating the plurality of electronic chip components that has been described herein; aligning the pressure contact surfaces of the individual electronic chip component relative to terminal pads of a circuit carrier; and pressure-contacting the individual chip component to the external circuit carrier by using a heat and pressure pulse.

The advantage of this contacting method is that the thermal load during the contacting step is limited in time and location, so that the chip component and the circuit carrier are thermally loaded only minimally. To that end, the chip component is taken by a contacting stamp, is positioned, and pressed at the mounting area, and a short, intensive heat pulse that is sufficient for melting the glue layer is applied, so that the pressure contact surfaces penetrate a potential layer of glue that may wet the pressure contact surfaces, whereas surface-wide adhesion is achieved between the chip component and the circuit carrier in the remaining region.

For glues which do not wet the metallic surfaces in the molten state, but which withdraw onto the non-metallic surfaces of the electronic chip component in the molten state because of their surface tension, the intensive contacting occurs immediately upon the placement of the electronic chip component on the external circuit carrier using the contacting stamp, without interference by glue residues on the pressure contact surfaces.

The heat pulse can be emitted by infrared radiation, which permeate silicon chip components particularly well, whereby the meltable glue contains pigment powder, i.e. fill powder, which absorbs infrared radiation for transmitting and absorbing the heat, so that a localized heating and liquefying of only the glue layer is achieved.

Another method for incorporating a heat pulse can be carried out using a microwave impulse, which acts directly on the glue layer, for instance by way of a microwave attachment of the contacting stamp, whereby a microwave absorbing glue is utilized.

In another embodiment of the method, the contact layer is selectively applied by a currentless deposition technique. Such currentless deposition baths are inexpensive and guarantee that a pressure contact elevation grows only on the metallic surfaces of the electrically conductive contact surfaces of a wafer, whereas the remaining surface region of the semiconductor wafer can be kept free of a currentless deposition by corresponding bath movements.

The wave bath technique is another preferred technique for selectively depositing a contact layer; however, it can only be used for contact materials that are meltable at lower temperatures. Such wave bath materials contain indium alloys, which have the additional advantage that indium oxides that form remain conductive and are therefore suitable for pressure contact.

In another embodiment, the selective deposition of elevated pressure contact surfaces occurs by the currentless deposition of a nickel-gold alloy, which is particularly resistant to oxidation because of the gold content.

Another exemplary embodiment of the selective depositing of the pressure contact material involves deposition or application through a mask. Such masks can consist of metal films with corresponding openings for depositing the pressure contact material by evaporation or sputtering. A selective deposition can also be achieved by depositing a closed layer of pressure contact material on the semiconductor wafer and then selectively etching, preferably by a plasma etching method, using a corresponding masking technique. But wet-chemical etching processes that etch away all metal surfaces that are not covered by the mask can also be used. The mask itself then consists of a photolithographically deposited layer of photosensitive resist. The superficial depositing of the pressure contact material can be accomplished by sputtering, vapor deposition, or plasma deposition.

The advantage of offering different techniques for selectively depositing the pressure contact material (i.e. the contact layer) is that a suitable and optimized method can be used for any instance of application, depending on the size of the pressure contact surfaces that will be deposited on the electronic chip component. Because the cost outlay for producing elevated contact pressure surfaces decreases as the pressure contact surface area increases, it can be advantageous to arrange the microscopic contact surfaces of the integrated circuits on the semiconductor chip with sufficient spacing that wide pressure contact surfaces, which are inexpensive to produce, can be arranged on the chip surface and are conductively connected with the microscopic contact surfaces of the integrated circuit. In this context, "wide" means edge lengths over 25 $\mu$m, and "microscopic" means measurable only with a light microscope.

In a development of the inventive method, the application of a layer of the above described glue is accomplished by laminating-on an adhesive film. If the material of the adhesive film is non-wetting for metallic surfaces, then in the molten heating of the laminated adhesive layer, the metallic pressure contact surfaces are cleared, while the glue concentrates between the pressure contact surfaces.

In another embodiment of the method, the adhesive layer can be sprayed on, with the glue for the adhesive layer first being dissolved in a solvent and then being uniformly spread into an adhesive layer on the semiconductor wafer upon the evaporation of the solvent. The adhesive layer can also be sprayed on with the glue in a molten state, whereby a glue layer hardens on the wafer surface. Out of these two possibilities, the application of a glue layer with a glue that is diluted in a solvent is the preferred method. In the spraying of an adhesive layer, this layer is initially equally thick on the pressure contact surfaces and in the intervening spaces, so that the pressure contact surfaces must penetrate the adhesive layer in the mounting of the electronic chip component on an external carrier.

Immersion coating and spinning are techniques by which it is possible to achieve thickness differences between the adhesive layer on the pressure contact surfaces and the adhesive layer in the intervening spaces. In either case, a glue is preferably dissolved in solvents when the glue layer is applied.

A particularly advantageous method of applying the glue layer is roll coating, wherein film-forming media are deposited, and the roll coating ensures that the glue layer is substantially thinner on the pressure contact surfaces than in the intervening spaces. Lastly, another development of the method provides for a powder coating using film-forming media whereby the wafer is heated in the powder deposition so that the film-forming medium can spread out as an adhesive layer.

When the semiconductor wafers are produced according to the invention, having pressure contact surfaces and an adhesive layer at least between the surfaces, the wafers can be divided into individual semiconductor chip components and can be later magazined according to customer requirements without being encapsulated in a housing.

Other features which are considered as characteristic for the invention are set forth in the appended claims.

Although the invention is illustrated and described herein as embodied in an electronic chip component with an integrated circuit and fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a cross-sectional view taken through an external circuit carrier and an electronic chip component mounted thereon using pressure contacting between the chip component and the circuit carrier.

DESCRIPTION OF THE PREFERRED EMBODIMENTS

Figure 1:
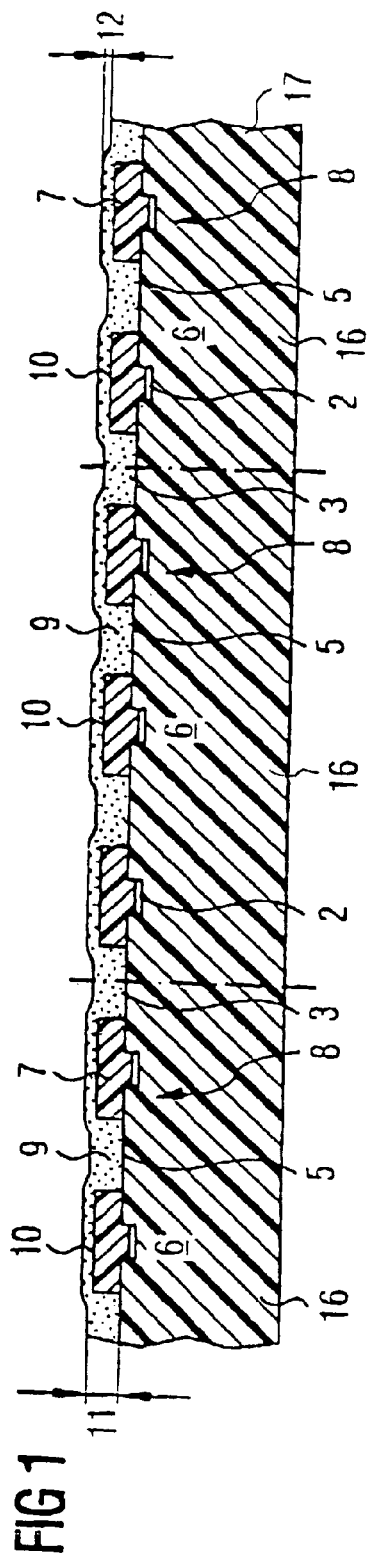
FIG. 1 is a cross-sectional view taken through a portion of semiconductor wafer having a plurality of integrated circuits for electronic chip components.

Referring now to the figures of the drawing in detail and first, particularly, to FIG. 1 thereof, there is shown a cross-sectional view through a portion of a semiconductor wafer 17 with a number of integrated circuits 6, three examples of which are represented. Neither the cross-sectional thickness nor the size of the chip components 16 is drawn to scale. Rather, for illustration purposes, the longitudinal extent of individual represented features of the chip components, such as the pressure contact surfaces 10, are represented substantially larger than they are in the real chip component. This is also true of the other representations in FIGS. 2 and 3.

FIG. 1 shows a semiconductor wafer 17 that has integrated circuits 6 embedded in its active region, three of which are represented. These integrated circuits 6 include a number of contact surfaces 2 on the active surface 3 of the semiconductor wafer 17, which are surrounded by, but not covered by a top non-conductive layer 5. The level of the contact surfaces 2 on the semiconductor wafer 17 is lower than that of the top non-conductive layer 5. In this embodiment of the invention, a pressure contact 7 having a pressure contact surface 10 is disposed over the contact surfaces 2. The pressure contact surface 10 is, on one hand, larger than the contact surface 2 on a semiconductor chip, and on the other hand, elevated relative to the top non-conductive layer 5. This metallic pressure contact surface 10 protrudes 1.5 µm to 8 µm beyond the level of the top non-conductive layer 5. The whole active surface 8 of the semiconductor wafer 17 is covered by a glue layer 9 whose thickness 11 between the pressure contact surfaces 10 is greater than its thickness 12 on the contact surfaces 10. The different thicknesses 11 and 12 of the glue layer 9 in the different regions of the semiconductor wafer 17 can be achieved by selecting suitable methods for applying the glue layer. In this embodiment, the glue layer 9 was applied to the surface of the semiconductor wafer by spinning, whereupon the contact surfaces 2 were superelevated with a pressure contact material.

The pressure contact material of the pressure contact surfaces 10 is deposited onto the wafer by the selective currentless deposition of a nickel-gold alloy. The glue layer consists of a meltable glue made of thermosetting plastic and can contain fillers that support heating using infrared radiation and/or microwave energy, so that such a glue layer 9 can be converted into its molten state by a short heat pulse. Given different wetting characteristics of the glue on metallic and non-conductive groundings, when the glue layer 9 is converted into a molten state, the glue between the pressure contact surfaces contracts and automatically clears the metallic surfaces.

After the application of this layer structure consisting of pressure contact surfaces 10 and glue regions on a semiconductor wafer 17 with a number of integrated circuits 6, the wafer 17 can be divided into individual electronic chip components 16 at the dotted boundary lines shown in FIG. 1 and these electronic chip components 16 can be magazined for further use without requiring a chip housing.

Figure 2:
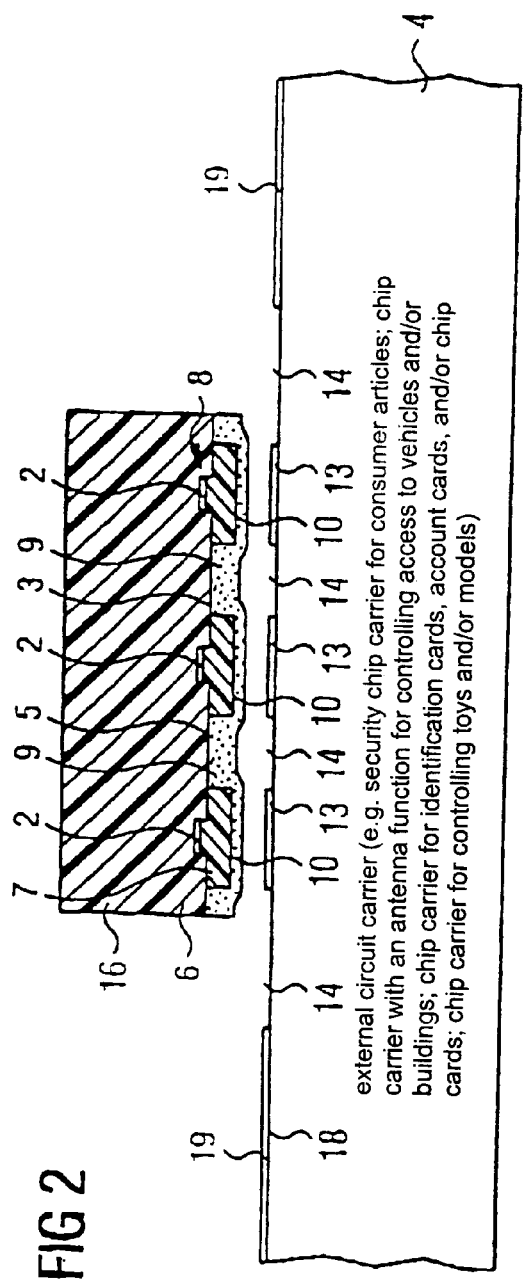
FIG. 2 is a cross-sectional view taken through an electronic chip component before it is mounted on an external circuit carrier.

FIG. 2 is a cross-sectional view through an electronic chip component 16 prior to mounting the chip component 16 on an external circuit carrier 4. The circuit carrier 4 includes metallic interconnects 19 which are conductively connected to contact terminal pads 13. The external chip carrier 4 consists substantially of an isolator material with a partially metallized surface. The pressure contact surfaces of a chip component 16 are arranged opposite the terminal pads 13 of the chip carrier, as represented in FIG. 2.

The chip component 16 is built according to FIG. 1, and the same reference characters are used for the same elements and components, there being no description of repeated reference characters. The positioning of an electronic chip component 16 over an external circuit carrier 4 can be accomplished using a contacting stamp, which is not represented. The contacting stamp can be constructed such that it has a pulsed heat source which delivers a short heat pulse for melting the glue layer 9 on the chip component 16. In this embodiment, the surface region 18 of the external circuit carrier 4 which is free of metal surfacing is dimensioned such that it can receive the excess glue of the glue layer 9.

FIG. 3 is a cross-sectional view through the external circuit carrier 4 represented in FIG. 2 with an electronic chip component 16 mounted on it by pressure contacting between the chip component 16 and the circuit carrier 4. The intervening spaces 14 are filled with glue after the chip component 16 is mounted on the circuit carrier 4, and the glue 15 that wets the metal-free areas provides for a secure contacting of the pressure contact surfaces 10 of the electronic chip component 16 to the contact terminal pads 13 of the external circuit carrier 4. The wetting characteristics of the glue 15 effectuate a concave contour 20 of the glue margin around the chip component 16.

With the shrinking of volume of the hardened glue 15 compared to its molten phase, the pressure contact surfaces 10 are pressed to the terminal pads 13 of the circuit carrier 4 followed by the setting of the glue 15, thereby producing a reliable electrical connection. The chip carrier can be part of a labeling and security component for consumer articles or a circuit component with an antenna function for access control, or a circuit carrier for an IC for improving the forgery-proofing of various documents, or a circuit carrier for ICs for chip cards or ICs in toys. Such applications take advantage of the fact that only one gluing step is needed for conductively connecting the chip component to the circuit carrier, and at the same time an extremely low mounting height can be achieved.

One of ordinary skill in the art should also understand that glue 15 can also be applied on the other contacting partner, the circuit carrier, instead of on the electronic chip component alone, and that simultaneous contacting can be performed in a pattern instead of individual contacting with a contacting stamp. Furthermore, the preparation of the pressure contact material of the chip is not limited to the currentless deposition of a nickel-gold alloy; rather, other pressure contact materials can be utilized for realizing the invention.

We claim:

1. An electronic chip component, comprising:
    a semiconductor chip having an integrated circuit therein; and
    a meltable glue layer;
    said semiconductor chip having an active surface including a plurality of contact surfaces for connecting said integrated circuit to an external circuit carrier;
    said integrated circuit having a top non-conductive layer defining a level, said contact surfaces being free of said top non-conductive layer;
    each one of said plurality of said contact surfaces including a contact layer having pressure contact material;
    said contact layer protruding beyond said level of said top non-conductive layer of said integrated circuit and being laterally larger than a corresponding contact surface;
    said contact layer having a height;
    said meltable glue layer having a thickness at least as great as said height of said contact layer; and
    said pressure contact material producing an electrical connection between said pressure contact material of said contact surfaces and respective terminal pads of the external circuit carrier without bonding or soldering.

2. The electronic chip component according to claim 1, in combination with the external circuit carrier, wherein the external circuit carrier is a security chip carrier for consumer articles.

3. The electronic chip component according to claim 1, in combination with the external circuit carrier, wherein the external circuit carrier is a chip carrier with an antenna function for controlling access to vehicles and/or buildings.

4. The electronic chip component according to claim 1, in combination with the external circuit carrier, wherein the external circuit carrier is a chip carrier for identification cards, account cards, and/or chip cards.

5. The electronic chip component according to claim 1, in combination with the external circuit carrier, wherein the external circuit carrier is a chip carrier for controlling toys and/or models.

6. The electronic chip component according to claim 1, wherein said glue layer has a greater thickness between said pressure contact material than on said plurality of said contact surfaces.

7. The electronic chip component according to claim 1, in combination with the external circuit carrier, wherein:
    the external circuit carrier has a non-conductive surface region with the terminal pads; and
    in a molten state, said glue layer wets said non-conductive top layer of said integrated circuit and the non-conductive surface region of the circuit carrier and does not wet said pressure contact material of the electronic chip component or the terminal pads on the circuit carrier.

8. The electronic chip component according to claim 1, wherein said pressure contact material is a ductile conductive metal alloy.

9. The electronic chip component according to claim 1, wherein said pressure contact material is an oxidation-resistant metal alloy.

10. The electronic chip component according to claim 1, wherein said pressure contact material is a nickel-gold alloy.

11. The electronic chip component according to claim 1, wherein said pressure contact material defines a plurality of pressure contact surfaces protruding 1.5 to 8 $\mu$m beyond said top non-conductive layer of said integrated circuit.

12. The electronic chip component according to claim 1, in combination with the external circuit carrier, wherein:
    the external circuit carrier has terminal pads configured with spaces therebetween; and
    said contact layer is configured into a plurality of pressure contact surfaces having a thickness; and
    to an extent said glue surpasses said thickness of said plurality of said pressure contact surfaces and is positioned on said plurality of said pressure contact surfaces, said glue partly fills the spaces between the terminal pads of the external circuit carrier subsequent to contacting the electrical chip component and the external circuit carrier.

13. The electronic chip component according to claim 1, wherein said glue is a thermosetting plastic.

14. A method for fabricating a plurality of electronic chip components, the method which comprises:
    providing a semiconductor wafer having a plurality of integrated circuits, the semiconductor wafer having an active surface with a plurality of contact surfaces and a non-conductive layer defining a level, the contact surfaces being free of the non-conductive layer;
    producing a plurality of superelevated pressure contact surfaces by selectively applying a contact layer including pressure contact material to each of the contact surfaces of the semiconductor wafer, the contact layer protruding beyond the level of the non-conductive layer and being laterally greater than a corresponding contact surface, the pressure contact material producing an electrical connection between the pressure contact material of the contact surfaces and respective contact areas of an external circuit carrier without a bonding or soldering process;
    applying a meltable glue layer having a thickness at least as great as a height of the contact layer, to the active surface of the semiconductor wafer; and
    obtaining a plurality of integrated circuits having a plurality of pressure contact surfaces by dividing the semiconductor wafer.

15. The method according to claim 14, wherein the step of applying the contact layer includes selectively applying the contact layer by currentless deposition.

16. The method according to claim 14, wherein the step of applying the contact layer includes selectively applying a nickel-gold alloy by currentless deposition.

17. The method according to claim 14, wherein the step of applying the contact layer includes selectively applying the contact layer using a wave bath technique.

18. The method according to claim 14, wherein the step of applying the contact layer includes selectively depositing the contact layer using a mask.

19. The method according to claim 14, wherein the step of applying the contact layer includes depositing a flat contact layer and then using a masking technique to selectively plasma-etch the flat contact layer.

20. The method according to claim 19, which comprises using sputtering to perform the step of depositing the flat contact layer.

21. The method according to claim 19, which comprises using vapor deposition to perform the step of depositing the flat contact layer.

22. The method according to claim 19, which comprises using plasma deposition to perform the step of depositing the flat contact layer.

23. The method according to claim 14, which comprises performing the step of applying the glue layer by laminating the glue layer.

24. The method according to claim 14, which comprises performing the step of applying the glue layer by spraying on the glue layer.

25. The method according to claim 14, which comprises performing the step of applying the glue layer by spinning on the glue layer.

26. The method according to claim 14, which comprises performing the step of applying the glue layer using immersion coating.

27. The method according to claim 14, which comprises performing the step of applying the glue layer using roll coating and a film-forming medium.

28. The method according to claim 14, which comprises performing the step of applying the glue layer using powder coating and a film-forming medium.

29. The method according to claim 14, which comprises storing the plurality of individual integrated circuits in a magazine, after performing the step of dividing the semiconductor wafer.

30. A method for contacting an electronic chip component and an external circuit carrier, the method which comprises:
    obtaining an individual electronic chip component by performing the method for fabricating the plurality of electronic chip components according to claim 14;
    aligning the pressure contact surfaces of the individual electronic chip component relative to terminal pads of a circuit carrier; and
    pressure-contacting the individual chip component to the external circuit carrier by using a heat and pressure pulse.

31. The method according to claim 30, wherein the step of applying the contact layer includes selectively applying the contact layer by currentless deposition.

32. The method according to claim 30, wherein the step of applying the contact layer includes selectively applying a nickel-gold alloy by currentless deposition.

33. The method according to claim 30, wherein the step of applying the contact layer includes selectively applying the contact layer using a wave bath technique.

34. The method according to claim 30, wherein the step of applying the contact layer includes selectively depositing the contact layer using a mask.

35. The method according to claim 30, wherein the step of applying the contact layer includes depositing a flat contact layer and then using a masking technique to selectively plasma-etch the flat contact layer.

36. The method according to claim 35, which comprises using sputtering to perform the step of depositing the flat contact layer.

37. The method according to claim 35, which comprises using vapor deposition to perform the step of depositing the flat contact layer.

38. The method according to claim 35, which comprises using plasma deposition to perform the step of depositing the flat contact layer.

39. The method according to claim 30, which comprises performing the step of applying the glue layer by laminating the glue layer.

40. The method according to claim 30, which comprises performing the step of applying the glue layer by spraying on the glue layer.

41. The method according to claim 30, which comprises performing the step of applying the glue layer by spinning on the glue layer.

42. The method according to claim 30, which comprises performing the step of applying the glue layer using immersion coating.

43. The method according to claim 30, which comprises performing the step of applying the glue layer using roll coating and a film-forming medium.

44. The method according to claim 30, which comprises performing the step of applying the glue layer using powder coating and a film-forming medium.

45. The method according to claim 30, which comprises storing the plurality of individual integrated circuits in a magazine, after performing the step of dividing the semiconductor wafer.

46. An electronic component, comprising:
    an external circuit carrier, said external circuit carrier having terminal pads with spaces therebetween;
    a semiconductor chip having an integrated circuit therein, said semiconductor chip having an active surface including a plurality of contact surfaces for connecting said integrated circuit to said external circuit carrier, said integrated circuit having a top non-conductive layer defining a level and said contact surfaces being free of said top non-conductive layer;
    a contact layer disposed on each one of said plurality of said contact surfaces, said contact layer having pressure contact material, said contact layer protruding beyond said level of said top non-conductive layer of said integrated circuit, said contact layer connecting said integrated circuit to said terminal pads of said external circuit carrier, said contact layer being laterally larger than a corresponding contact surface, and said contact layer having a thickness; and
    a meltable glue layer having a margin, said spaces between terminal pads being filled with meltable glue of said meltable glue layer, said margin having a concave contour;
    said pressure contact material producing an electrical connection between said pressure contact material of said contact surfaces and respective of said terminal pads of said external circuit carrier without bonding or soldering.

47. The electronic component according to claim 46, wherein said external circuit carrier is one of a group consisting of a security chip carrier for consumer articles, a chip carrier with an antenna function for controlling access to vehicles and/or buildings, a chip carrier for identification cards, account cards, and/or chip cards, and a chip carrier for controlling toys and/or models.

48. The electronic component according to claim 46, wherein said glue layer has a greater thickness between said pressure contact material than on said plurality of said contact surfaces.

49. The electronic component according to claim 46, wherein:
    said external circuit carrier has a non-conductive surface region and terminal pads; and
    in a molten state, said glue layer wets said non-conductive top layer of said integrated circuit and the non-conductive surface region of said circuit carrier and does not wet said pressure contact material of said semiconductor chip or said terminal pads on said circuit carrier.

50. The electronic component according to claim 46, wherein said pressure contact material is a ductile conductive metal alloy.

51. The electronic component according to claim 46, wherein said pressure contact material is an oxidation-resistant metal alloy.

52. The electronic component according to claim 46, wherein said pressure contact material is a nickel-gold alloy.

53. The electronic component according to claim 46, wherein said pressure contact material defines a plurality of pressure contact surfaces protruding 1.5 to 8 $\mu$m beyond said top non-conductive layer of said integrated circuit.

54. The electronic component according to claim 46, wherein said glue is a thermosetting plastic.

* * * * *